United States Patent [19]

Hughes

[11] 4,132,908
[45] Jan. 2, 1979

[54] DIGITAL-TO-ANALOG CONVERSION WITH DEGLITCH

[75] Inventor: Bill B. Hughes, Largo, Fla.

[73] Assignee: Smiths Industries, Inc., Clearwater, Fla.

[21] Appl. No.: 821,935

[22] Filed: Aug. 4, 1977

[51] Int. Cl.² ............... H03K 17/16; G06F 3/14; H01J 29/70
[52] U.S. Cl. .................. 307/353; 315/399; 307/239; 328/151; 328/165; 328/231; 340/347 SH; 364/855
[58] Field of Search ............. 307/240, 352, 353, 239; 328/151, 165, 166, 167, 231; 315/399, 408; 340/324 A, 347 SH; 365/855

[56] References Cited

U.S. PATENT DOCUMENTS

| | | | |
|---|---|---|---|
| 2,510,027 | 5/1950 | Torsch | 328/231 X |
| 2,680,806 | 6/1954 | Beste | 328/165 |
| 2,837,692 | 6/1958 | Denton | 328/231 X |
| 2,874,284 | 2/1959 | Conger | 328/165 X |
| 3,500,212 | 3/1970 | Berg | 364/855 X |
| 3,710,141 | 1/1973 | Zeiger | 307/353 |
| 3,851,260 | 11/1974 | Colin | 307/353 X |
| 3,869,085 | 3/1975 | Green | 364/855 |
| 3,906,305 | 9/1975 | Nillesen | 315/399 |
| 3,917,963 | 11/1975 | Wadlington | 307/352 X |
| 3,976,991 | 8/1976 | Hickin et al. | 340/324 A |

OTHER PUBLICATIONS

Hansen, "Burst Mode Sampling Amplifier," *IBM Tech. Discl. Bull.;* vol. 14, No. 7, pp. 2196–2197; 12/1971.

*Primary Examiner*—Larry N. Anagnos
*Attorney, Agent, or Firm*—Pollock, Vande Sande & Priddy

[57] ABSTRACT

A deglitch circuit is provided to connect a source of changing voltage or current to a utilization device to eliminate unwanted voltage excursion contemporaneous with changes in amplitude. The deglitching circuit includes one transformer winding with a center tap connected to the source and a pair of serially connected diodes connected to terminals of the winding. Another winding of the transformer is connected to a source of potential through switches which allow the other winding to alternately conduct current in one or another sense. Changes in the sense of current conduction through the other winding induce a voltage into the one transformer winding. Depending on the change in current this voltage may forward bias the diodes and provide the effect of a closed switch between the source and the circuit output, which is taken at the junction of the diodes. With change of current in the other sense, a voltage is induced into the one winding to reverse bias the diodes and thus providing, in effect, an open switch between the voltage source and circuit output.

6 Claims, 5 Drawing Figures

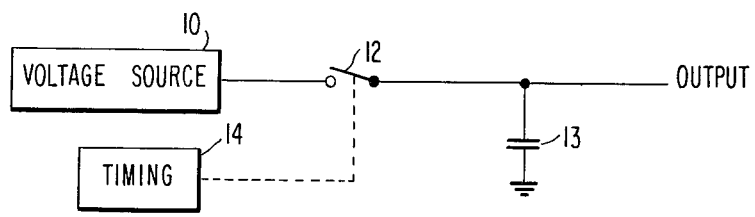
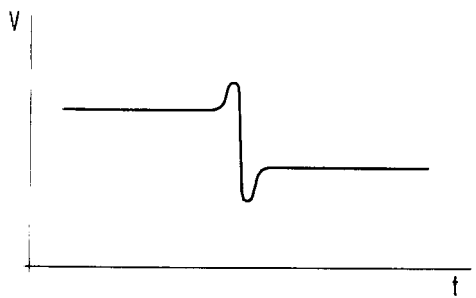
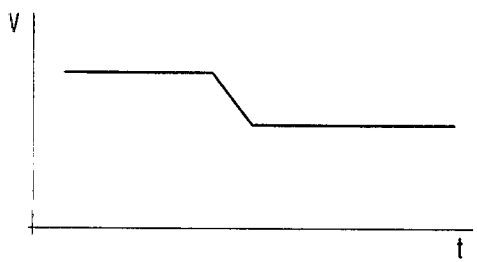
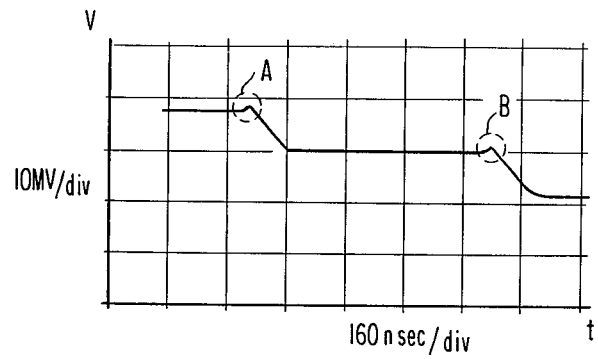
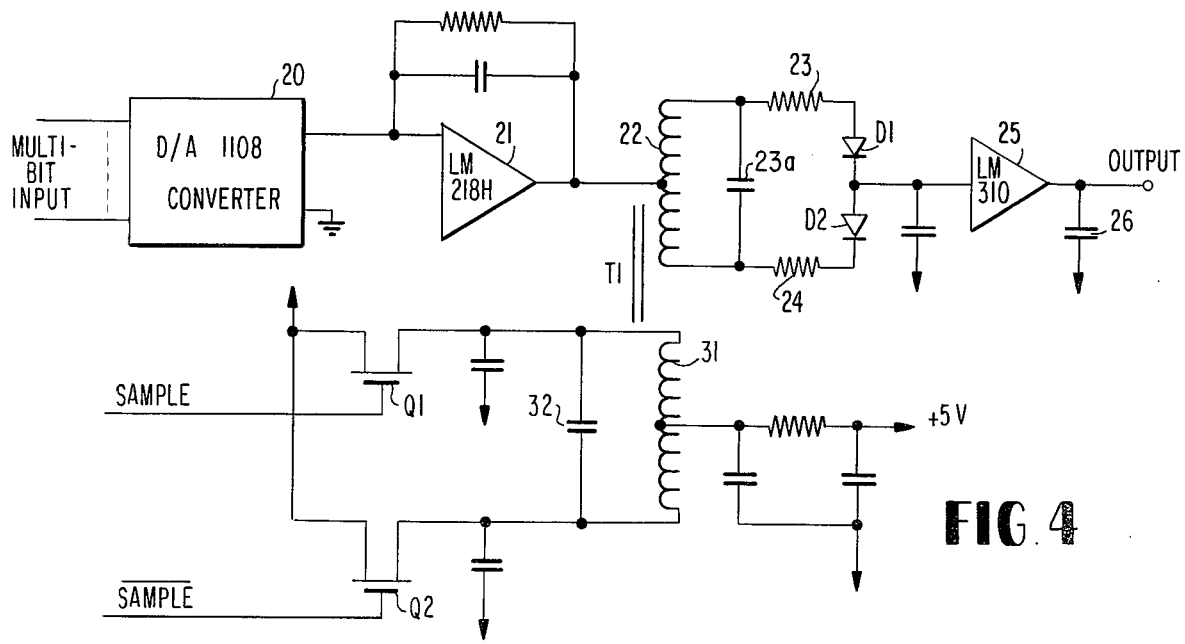

DIGITAL-TO-ANALOG CONVERSION WITH DEGLITCH

FIELD OF THE INVENTION

The present invention relates to deglitching circuits, i.e., circuits to remove switching transients.

BACKGROUND OF THE INVENTION

In a variety of circuits in which voltage changes are contaminated with switching transients or the like, deglitching circuits have been provided to eliminate the unwanted switching transients. A typical example of such deglitching circuit is contained in U.S. Pat. No. 3,869,085. That patent relates to a controlled current vector generator for cathode ray tube displays. As disclosed, a computer generates digital signals representing desired deflections for a cathode ray tube. A digital-to-analog converter converts the computer's digital output to analog form, a deglitching circuit is included connected between the output of the digital-to-analog converter and the cathode ray tube deflection system to prevent switching transients, or glitches, from reaching the deflection system of the cathode ray tube. Although the preferred embodiment of the invention to be disclosed hereinafter is also for use with a cathode ray tube system, deglitching circuits have wide application in other arrangements in which switching transients contaminate an analog signal level or level transition.

An ideal deglitching circuit is shown in FIG. 1, where a voltage source 10 is coupled to one terminal of a timed switch 12 whose other terminal is connected to the output, with a capacitor 13 connected between the other terminal of the switch 12 and ground. A timing control 14 controls the condition of the switch 12.

In one typical arrangement, source 10 is actually a digital-to-analog converter which exhibits high frequency voltage spikes in the output voltage occasioned by transients generated during the switching which takes place in the digital-to-analog converter. The ideal deglitching circuit of FIG. 1 is arranged to close the switch 12 after the digital-to-analog converter has settled to charge the capacitor 13 to the analog voltage. Just prior to the digital-to-analog converter changing its output, the timing control 14 opens the switch 12 and maintains the switch 12 in an open condition until the new value provided by the digital-to-analog converter has settled at which time the switch is again closed so that the capacitor 13 can be charged or discharged to a new potential.

Typically, the deglitching circuit requires rapid switch operation and requires that switch 12 does not capacitively couple transients into the output. In a typical arrangement employing digital clock rates of 2 mHz, the period between possible changes of the output of the digital-to-analog converter is 500 nanoseconds. A good digital-to-analog converter such as Analog Devices 1108 settles in current to within 0.05% of its steady state value in 60 nanoseconds. Converting this current signal to a voltage within some predetermined range can require 200 nanoseconds employing a 15 mHz. LM 118 monolithic operational amplifier. This leaves only 300 nanoseconds of the available 500 nanosecond period to close the switch, charge the capacitor to the new voltage and again open the switch. While field effect transistors are rapid switching devices they are unusable in this application because the gate voltage excursion is capacitively coupled into the output as another transient.

The referenced patent employs a diode bridge as the switch. When current passes through the bridge the diodes conduct allowing the digital-to-analog converter output to be connected to the buffer amplifier input. When bridge current is terminated the diode bridge appears as an open switch. Current sources and sinks steer current through the bridge. Inasmuch as the turn-on and turn-off times of the various current sources employed with the bridge are not equal, switching transients are coupled through to the output. While the switching transients are reduced over that which would have been available without use of the diode bridge as a switch, nevertheless, in certain applications these switching transients are disadvantageous.

Accordingly, it is an object of the present invention to provide a deglitching circuit with markedly reduced switching transients in the output. It is another object of the present invention to provide a deglitching circuit which is capable of the rapid operation required, for example, commensurate with 2 mHz. digital clock rates, and which at the same time, shows markedly reduced switching transients as compared to the deglitching circuit of the referenced patent.

SUMMARY OF THE INVENTION

These and other objects of the invention are met by providing a deglitching circuit in which the switch includes one transformer winding which has a center tap connected to the output of the source, i.e., the output of the digital-to-analog converter. A pair of serially connected diodes are connected to terminals of the one winding, and an output is taken from the junction of the diodes which is connected to a grounded capacitor. Another winding of the transformer is connected to a source of potential having switching devices arranged to allow current to flow through the other winding in either of two possible senses. With one current transition in the other winding, a voltage is induced into the one winding in one sense so as to forward bias the diodes. In this condition, the switch is closed and the output capacitor is enabled to be charged. With a current transition of the opposite sense in the other winding, a voltage is induced into the one winding which serves to reverse bias the diodes, opening the circuit connection between the output of the voltage source and the capacitor.

BRIEF DESCRIPTION OF THE DRAWINGS

A preferred embodiment of the invention will now be disclosed in the following portions of the specification when taken in conjunction with the attached drawings in which:

FIG. 1 is a block diagram of an ideal deglitching circuit;

FIGS. 2 and 3 are voltage versus time wave forms showing the input and output of a deglitching circuit;

FIG. 4 is a schematic of a preferred embodiment of the deglitching circuit of the present invention; and FIG. 5 is a graphic example of operation of the inventive circuit.

DETAILED DESCRIPTION OF A PREFERRED EMBODIMENT

As mentioned above, FIG. 1 is a block diagram of the ideal deglitching circuit. As applied to a display apparatus, the voltage source 10 can actually be a digital-toanalog converter driven by the output of a graphics generator such as the graphics generator disclosed in the Green et al, co-pending application Ser. No. 821,936, filed Aug. 4, 1977, entitled GRAPHICS GENERATOR, and assigned to the assignee of the present invention. That graphics generator includes a digital output which is converted by a digital-to-analog converter to analog form for application to a deflection system of a cathode ray tube. Thus, for example, the voltage source 10 can actually be a digital-to-analog converter. FIG. 2 is a voltage versus time-wave form of a typical transition in the output of such a digital-to-analog converter. Clearly illustrated is the switching transients, or glitches, the presence of which is to be eliminated by operation of the deglitching circuit. FIG. 3 is the desired output of the deglitching circuit which shows a clean transition from one voltage level to another.

A preferred embodiment of the invention is illustrated in FIG. 4. As shown there, a digital-to-analog converter 20, which may be an Analog Devices 1108, receives a multi-bit input, for example, a 12 bit input and provides an analog output corresponding thereto. The output is coupled to the input of an operational amplifier 21 with a parallel RC feedback circuit. A transformer T1 has a secondary winding 22 with a center tap coupled to the output of the amplifier 21. A capacitor 23a is coupled in parallel with the winding 22 and a pair of serially connected diodes D1 and D2 are connected through resistors 23 and 24 to the terminals of the secondary winding 22. The diodes D1 and D2 are connected cathode-to-anode with the cathode-anode connection brought out as an output, providing an input to a buffer amplifier 25. A capacitor 26 connected between the output of the buffer amplifier 25 and ground provides the deglitching circuit output.

The transformer T1 has a primary winding 31, the center tap of which is connected to a voltage source through a resistor capacitor network. A capacitor 32 is coupled in parallel to the winding 31. The terminals of the winding 31 are connected through field effect transistors Q1 and Q2 to ground. The gate terminal of transistor Q1 is provided with the signal SAMPLE and the gate terminal of transistor Q2 is connected to the signal $\overline{\text{SAMPLE}}$.

The circuit including winding 22 and diodes D1 and D2 comprises the switch. The switch is effectively closed when a current transition in winding 31 induces a potential in winding 22 to forward bias the diodes. Advantageously, both diodes are brought to conduction by a simultaneously applied potential. In this condition, the center tap voltage is available at the junction of the diodes. Furthermore, since the induced potential is induced evenly throughout winding 22, it has no effect at the output.

Since the induced potential arises due to a current transition, current conduction in the primary must be continually switched to enable the switch to operate. Furthermore, the equivalent resistance of the RC charging circuit for the output capacitor is desirably low to enable rapid charging of this capacitor.

When a current transition in winding 31 induces a potential of the opposite sense the diodes are back biased and the switch is open. This operation is possible so long as the induced potential is greater than the range of voltage available from the analog to digital converter. To effect this operation, the winding 31 is allowed to conduct current, first in one sense and then the other.

When the SAMPLE input is high, FET Q2 conducts, and with $\overline{\text{SAMPLE}}$ low, Q1 is cut off. Accordingly, current flows from the source of potential through the lower half of the primary winding 31 and thence through the FET Q2 to ground. When SAMPLE goes low and $\overline{\text{SAMPLE}}$ goes high, Q1 is turned on and Q2 is turned off. Under these circumstances, current flows from the voltage source through the upper half of the primary winding 31 and thence through the FET Q1 to ground. Thus, current flows through the transformer primary 31 in one of two senses depending upon which of the FETS Q1 or Q2 is enabled. At the transition in current flow, a voltage is induced into the secondary winding 22. Of course, the polarity of the voltage induced in the winding 22 depends upon the sense of current transition in the primary winding 31. The windings 31 and 22 are arranged such that the transition occasioned by Q1 turning off and Q2 turning on induces a potential in the secondary winding 22 of such polarity as to forward bias the diodes D1 and D2. Likewise, a current transition in the opposite sense, occasioned by Q2 turning off and Q1 turning on, produces a polarity in the secondary 22 to reverse bias the diodes D1 and D2.

When the diodes D1 and D2 are forward biased the output of amplifier 21 is connected to the input of the amplifier 25 so as to charge capacitor 26 to a potential corresponding to the output of the digital-to-analog converter 20. On the other hand, when the diodes D1 and D2 are back biased, the "switch" is open, and thus the capacitor 26 does not respond to changes in the output voltage of the digital to analog converter 20.

A significant advantage of the inventive circuit is the fact that the voltage induced into the secondary 22 forward biases or reverse biases the diodes D1 and D2 simultaneously, thus eliminating the potential for spurious outputs caused by non-simultaneous operation of the diodes D1 and D2. Such non-simultaneous operation of the diode switches is a distinct possibility in, for example, the prior art arrangement exemplified by U.S. Pat. No. 3,869,085. Operation of the diode switches is synchronized with the digital-to-analog conversion function of the converter 28 through the timing of the SAMPLE signals. Such signals can be derived, for example, from timing signals associated with the apparatus which provides the input to the digital-to-analog converter 20. For example, in the referenced copending application Ser. No. 821,936, filed Aug. 4, 1977, entitled GRAPHICS GENERATOR, the signal XYSUM, or $\overline{\text{XYSUM}}$ can be used to generate the necessary SAMPLE signals. That is, more particularly, the XYSUM signal strobes a new digital value into an output register as disclosed in the referenced application. By employing the same signal, suitably delayed to account for the settling time of the converter 20, the SAMPLE signal is generated.

In one particular embodiment of the invention, employing a 2 mHz. clock rate, the digital to analog converter 20 comprised an Analog Device 1108, amplifier 21 comprised a LM218H, the transformer windings 31 and 22 were wound with maximum separation of primary and secondary employing 32 gauge wire with 40 turns in the primary 31 and 100 turns in the secondary 22. The output voltage to the deflection amplifier, provided by the capacitor 26, was in the range ±5 volts. The resistors 23 and 24 were 200 Ohm 1% resistors, and the capacitor 26 was 100 picofarads.

With this arrangement, FIG. 5 is an illustration of the output voltage available at the capacitor 26. As shown there, the glitch associated with the voltage transitions has been significantly reduced in magnitude (compare this with FIG. 2). The two glitches shown in FIG. 5, referenced A and B, are each of approximately 1 millivolt in amplitude.

The disclosed circuit can also be termed a sample and hold circuit for it samples the output of source 20, when that output is steady, and holds the sample during transitions of the output. After the transition is over and the output has settled, another sample is taken, and so on.

What is claimed is:

1. A deglitching circuit for connection between a utilization device and a source of voltage periodically changing in amplitude to eliminate unwanted voltage excursions generated when said source changes in amplitude, comprising timed switching means serially connected to said source and to a capacitor, wherein the improvement comprises an improved timed switching means including:

a transformer winding with a center tap connected to said source, a pair of serially connected diodes connected across said winding with said capacitor connected to a junction of said diodes, another winding of said transformer, said another winding connected to a source of potential through switching devices for alternately conducting current through said another winding in one or another sense whereby a current transition in said another winding in one sense induces a potential in said one winding to reverse bias said diodes providing an open switch between said source and said capacitor.

2. The apparatus of claim 1 wherein said another winding has a center tap connected to said source of potential, said switching devices comprising a pair of switches each connecting one terminal of said another winding to ground, each of said switches alternately conducting and cut-off.

3. The apparatus of claim 2 wherein each of said switches comprises an FET.

4. A sample and hold circuit connected between an input source and an output capacitor comprising switching means with means responsive to a sample signal for closing said switch in which the improvement comprises an improved switching means comprising:

a transformer having a center-tapped secondary winding connected to said input source and a pair of diodes connected across said winding, said output capacitor connected to a junction of said diodes, and a primary winding of said transformer connected to a potential source with switches connected to said primary winding and responsive to said sample signal to allow current flow alternately in one and another direction in said primary winding.

5. The apparatus of claim 4 in which said diodes are connected cathode to anode.

6. The apparatus of claim 4 in which each said switch comprises an FET.